(12) United States Patent
Kim et al.

(10) Patent No.: US 7,593,288 B2
(45) Date of Patent: Sep. 22, 2009

(54) SYSTEM FOR PROVIDING READ CLOCK SHARING BETWEEN MEMORY DEVICES

(75) Inventors: Kyu-hyoun Kim, Mount Kisco, NY (US); Paul W. Coteus, Yorktown, NY (US)

(73) Assignee: International Business Machines Corporation, Armonk, NY (US)

( * ) Notice: Subject to any disclaimer, the term of this patent is extended or adjusted under 35 U.S.C. 154(b) by 83 days.

(21) Appl. No.: 11/959,711

(22) Filed: Dec. 19, 2007

(65) Prior Publication Data

US 2009/0161475 A1    Jun. 25, 2009

(51) Int. Cl.
*G11C 7/00* (2006.01)
(52) U.S. Cl. .............................. 365/233.12; 365/233.1; 365/191
(58) Field of Classification Search ............. 365/233.12
See application file for complete search history.

(56) References Cited

U.S. PATENT DOCUMENTS

| | | | |
|---|---|---|---|
| 5,268,932 A * | 12/1993 | Okuzono | 375/354 |
| 5,513,135 A | 4/1996 | Dell et al. | |
| 6,381,685 B2 | 4/2002 | Dell et al. | |
| 7,082,071 B2 * | 7/2006 | Knaack et al. | 365/221 |
| 7,246,252 B1 * | 7/2007 | Gupta et al. | 713/500 |
| 7,478,193 B2 * | 1/2009 | Becca et al. | 711/108 |
| 2008/0086590 A1 * | 4/2008 | Urabe | 711/103 |

* cited by examiner

*Primary Examiner*—Tan T. Nguyen
(74) *Attorney, Agent, or Firm*—Cantor Colburn LLP

(57) ABSTRACT

A system for providing read clock sharing between memory devices. The system includes a memory device having an external clock receiver, a read clock receiver, and a phase comparator. The phase comparator synchronizes an internal read clock generated at the memory device. The phase comparator additionally synchronizes one of an external clock received by the external clock receiver and an external read clock received by the read clock receiver. The results of the synchronizing are utilized to refresh the internal read clock. The memory device also includes a mechanism, a read clock driver and a mode register fit. The mechanism is utilized to select between the external clock and the external read clock as input to the phase comparator. The read clock driver outputs the internal read clock generated at the memory device to a read clock output pin. The mode register bit controls the selection of the mechanism, the enabling and disabling of the read clock receiver and the enabling and disabling of the read clock driver.

20 Claims, 6 Drawing Sheets

SYSTEM FOR PROVIDING READ CLOCK SHARING BETWEEN MEMORY DEVICES

BACKGROUND OF THE INVENTION

This invention relates generally to computer memory, and more particularly to providing read clock sharing between memory devices.

Contemporary high performance computing main memory systems are generally composed of memory devices, which are connected to one or more processors via one or more memory control elements. These memory devices are generally located on a memory card module and connected through a module connector to a mother board.

FIG. 1 depicts a contemporary system composed of an integrated processor chip 100, which contains one or more processor elements and an integrated memory controller 110. In the configuration depicted in FIG. 1, multiple independent cascade interconnected memory interface busses 106 are logically aggregated together to operate in unison to support a single independent access request at a higher bandwidth with data and error detection/correction information distributed or "striped" across the parallel busses and associated devices. The memory controller 110 attaches to four narrow/high speed point-to-point memory busses 106, with each bus 106 connecting one of the several unique memory controller interface channels to a cascade interconnect memory subsystem 103 (or memory module, e.g., a dual in-line memory module or "DIMM") which includes at least a hub device 104 and one or more memory devices 109. In the system depicted in FIG. 1, there are "n" ranks. Typically those "n" ranks share the common narrow/high speed busses and are not accessed simultaneously. Thus, data signal pins of those ranks are directly connected to common signal lines in a time-multiplexing manner. However, read clock signals cannot be directly connected in the same manner because they are driven by individual chips (e.g. memory devices) all the time, whereas data signals are driven by a certain chip for a short period of time when the chip is being accessed. Some systems further enable operations when a subset of the memory busses 106 are populated with memory subsystems 103. In this case, the one or more populated memory busses 108 may operate in unison to support a single access request.

FIG. 2 depicts a memory structure with cascaded memory modules 103 and unidirectional busses 106. One of the functions provided by the hub devices 104 in the memory modules 103 in the cascade structure is a re-drive function to send signals on the unidirectional busses 106 to other memory modules 103 or to the memory controller 110. FIG. 2 includes the memory controller 110 and four memory modules 103, on each of two memory busses 106 (a downstream memory bus with 24 wires and an upstream memory bus with 25 wires), connected to the memory controller 110 in either a direct or cascaded manner. The memory module 103 next to the memory controller 110 is connected to the memory controller 110 in a direct manner. The other memory modules 103 are connected to the memory controller 110 in a cascaded manner. Each memory module 103 may include one or more ranks of memory devices 109. Although not shown in this figure, the memory controller 110 may be integrated in the processor 100 and may connect to more than one memory bus 106 as depicted in FIG. 1.

Current dynamic random access memory (DRAM) devices generally utilize a strobe to perform data reads. For future DRAM devices such as double data rate four (DDR4), a (free-running) read clock is preferred instead of a strobe because inter-symbol-interference within a strobe due to a preamble reduces a timing margin and the amount of the reduction is not negligible as the data rate increases (e.g., beyond three gigabytes per second).

However, a read clock cannot share the same signal lane and connector pin because a device should always transmit its signal toward a memory controller. This is because a read clock is always driven by all the chips (e.g. memory devices) in different ranks. Therefore, using a read clock instead of a strobe might increase the total connector pin count, in particular for multi-rank memory modules. Typically, a read clock is provided per four or eight data signals. In single rank memory modules the number of total read clock pins is one quarter or one eighth of the number of total data pins. Because a read clock signal cannot be shared between different ranks, the total number of read clock pins in a memory module will be increased proportionally to the number of ranks. For example, assume that a single-rank memory module has eighteen memory devices and each memory device has four data signals. In this case, the total number of data pins required for the module is 18×4=72, and the total number of read clock pins required for a module is 18×4/4=18 (same as the number of chips, because each chip will have one read clock). For a dual-rank device module, the number of data pins is 72 because data signals will share module pins between 2 ranks. But the number of read clocks is 18×2=36 because they cannot be shared between ranks, so each read clock signal in each memory device is pulled out to the module pin. Thus, a multi rank memory module will have to have more read clock pins as the number of ranks increase, whereas a bus or a connector pin for a strobe can be shared between two or four memory devices in different ranks.

It would be highly desirable to be able to utilize a read clock without increasing a connector pin count for multi-rank memory modules.

BRIEF SUMMARY OF THE INVENTION

An exemplary embodiment includes a memory device having an external clock receiver, a read clock receiver, and a phase comparator. The phase comparator synchronizes an internal read clock generated at the memory device with either the external clock received by the external clock receiver or an external read clock received by the read clock receiver. The results of the synchronizing are utilized to refresh the internal read clock. The memory device also includes a mechanism, a read clock driver and a mode register fit. The mechanism is utilized to select between the external clock and the external read clock as input to the phase comparator. The read clock driver outputs the internal read clock generated at the memory device to a read clock output pin. The mode register bit controls the selection of the mechanism, the enabling and disabling of the read clock receiver and the enabling and disabling of the read clock driver.

Another exemplary embodiment includes a memory device having an external clock receiver for receiving an external read clock. The memory device further includes a read clock receiver for receiving the external clock and a phase comparator which synchronizes the external clock and the external read clock. The results of the synchronizing are utilized to generate an internal read clock and a read clock driver for outputting the internal read clock. The memory devices also include a read clock driver for outputting the internal read clock.

A further exemplary embodiment includes a memory module having a read clock output pin and a plurality of memory devices. The memory devices share the read clock output pin.

BRIEF DESCRIPTION OF THE DRAWINGS

Referring now to the drawings wherein like elements are numbered alike in the several FIGURES.

DETAILED DESCRIPTION OF EXEMPLARY EMBODIMENTS

An exemplary embodiment of the present invention provides the ability to share a read clock between memory devices. In an exemplary embodiment, the read clock is shared between memory devices in different memory ranks.

Figure 1:
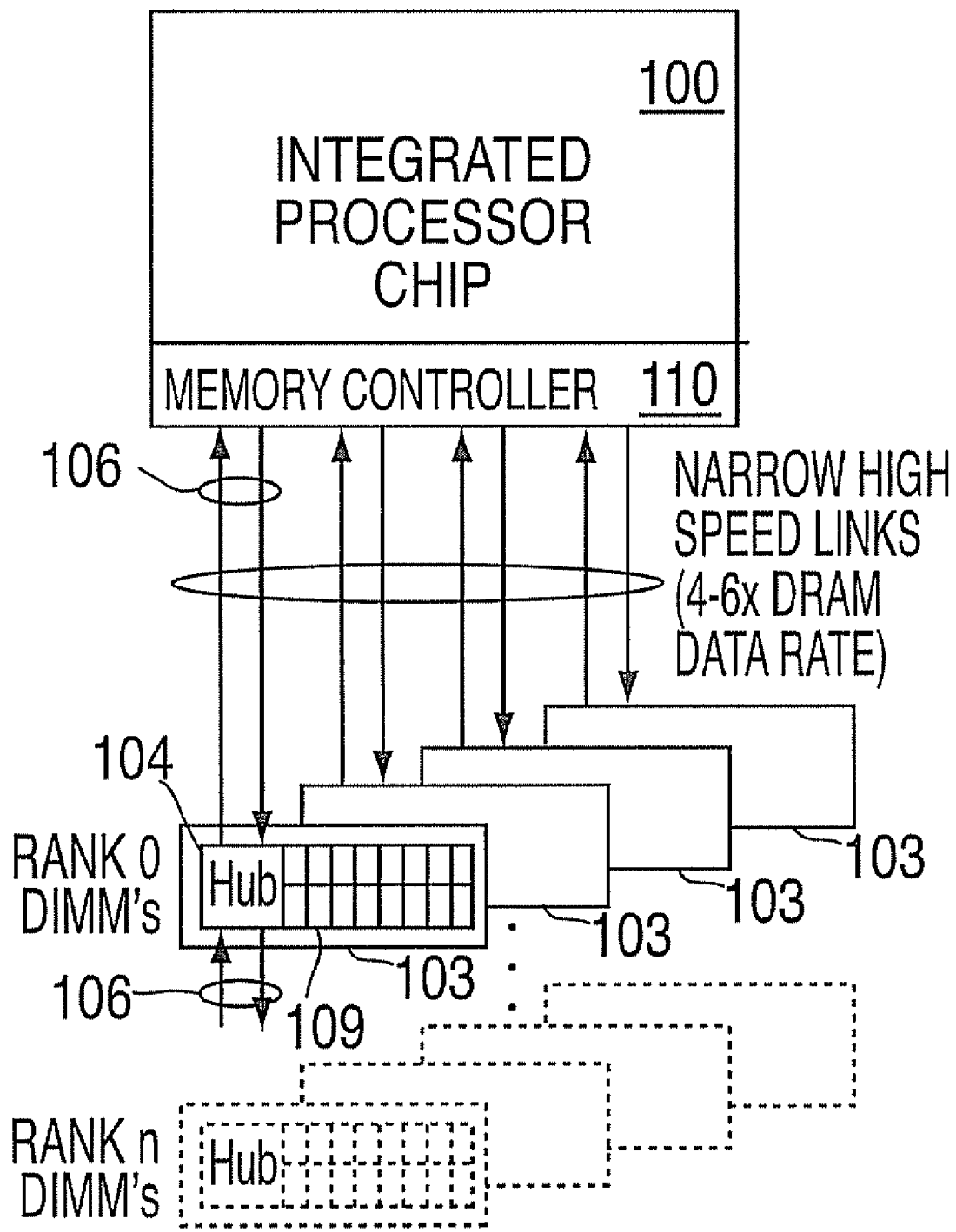
FIG. 1 depicts a cascade interconnect memory system with unidirectional busses.
Figure 2:
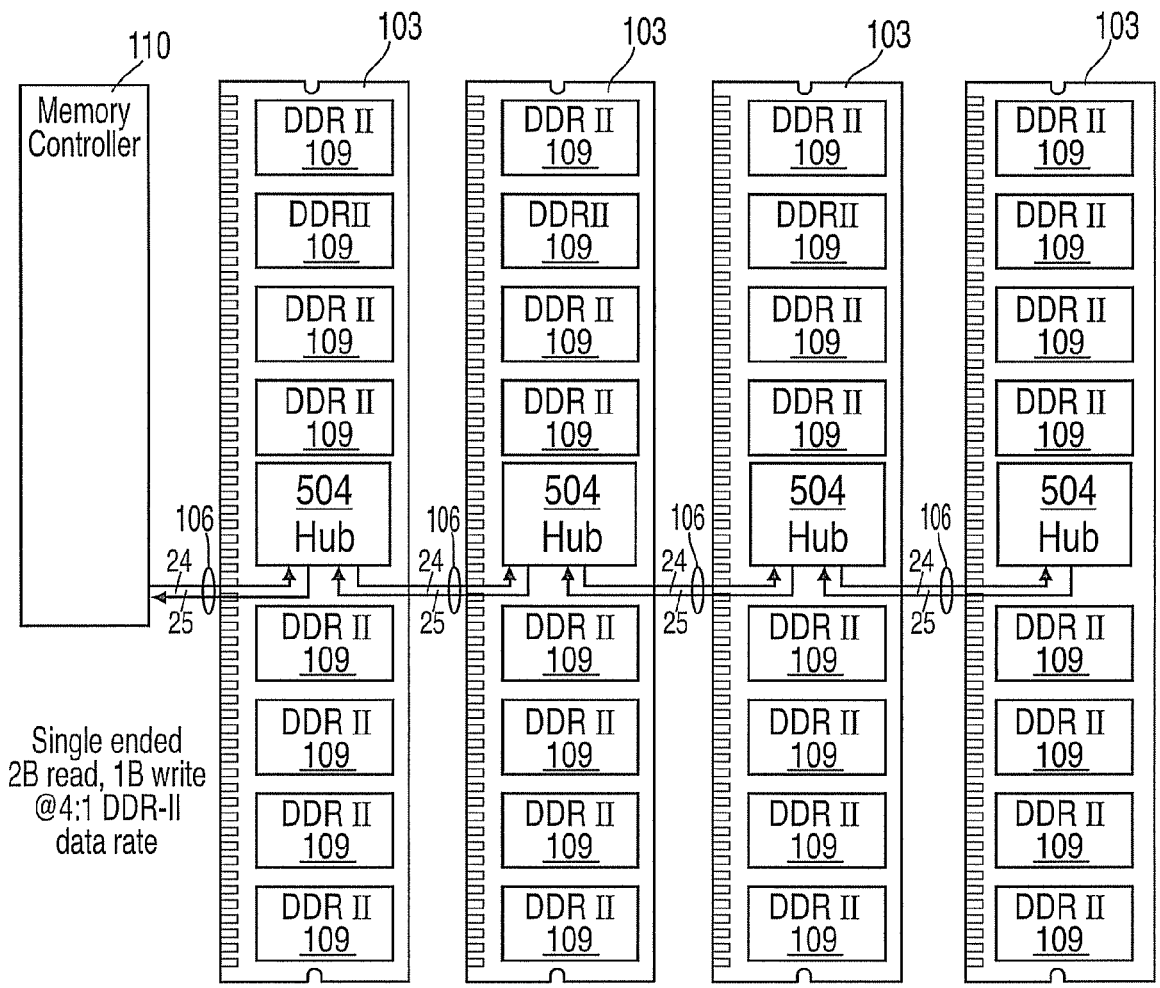
FIG. 2 depicts a cascade interconnect memory system with unidirectional busses.
Figure 3:
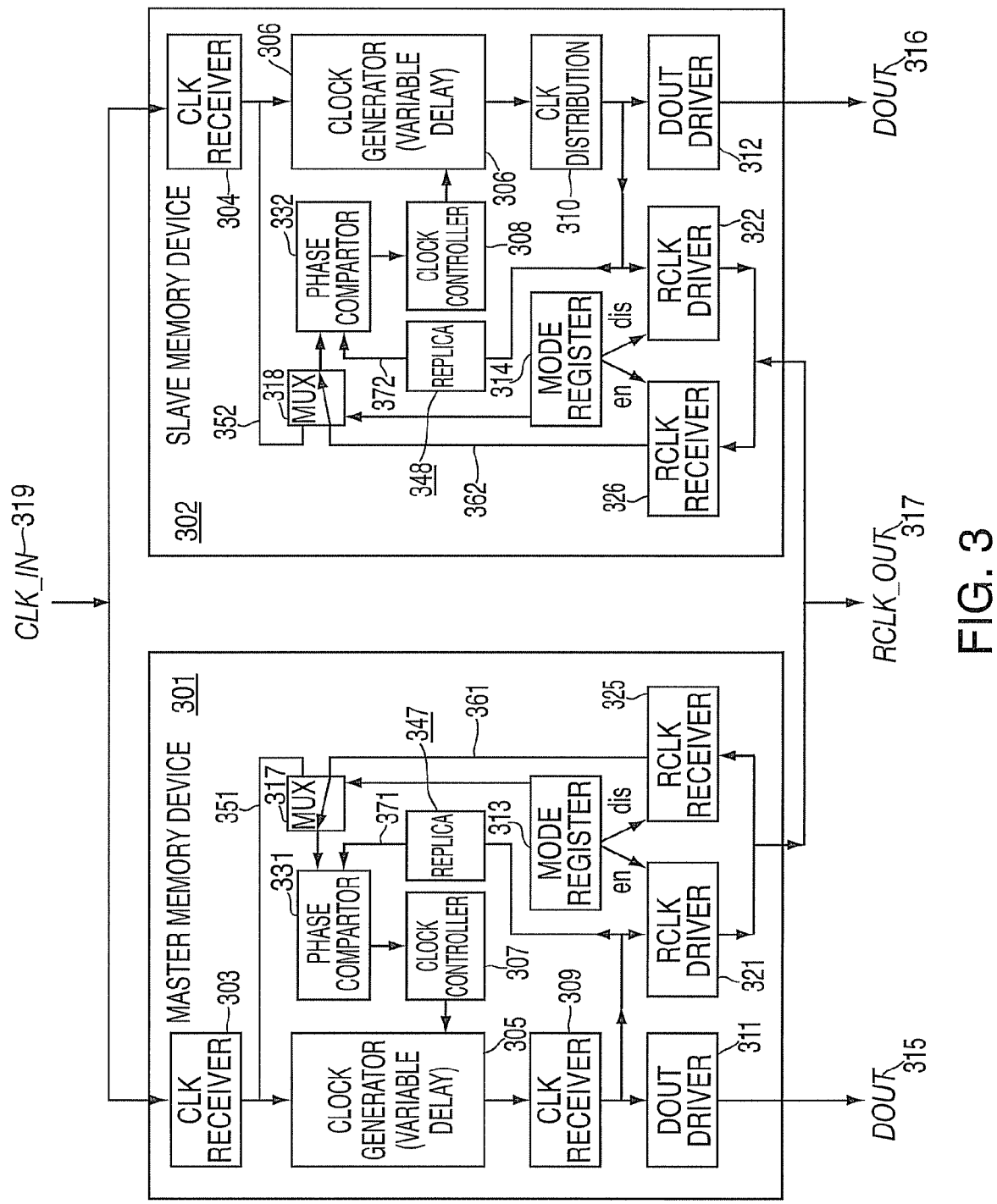
FIG. 3 is a block diagram of an exemplary embodiment of the present invention that allows two or more memory devices to share a read clock signal.

FIG. 3 is a block diagram of an exemplary embodiment of the present invention where two memory devices are sharing a read clock signal. Both memory devices (or chips) have their own data bus, but there is only one signal lane, or read clock output pin, per two memory devices. In addition, only one of two memory devices, the master memory device 301, transmits a read clock to the read clock output pin. A memory controller fetches data from the slave memory device 302 using the output read clock 316, RCLK_OUT, transmitted from the master memory device 319 chip via the read clock output pin.

The block diagram in FIG. 3 includes a master memory device 301 and a slave memory device 302. Whether a memory device is utilized as a master memory device 301 or a slave memory device 302 depends on the content (e.g., value of a bit) of the mode register 313, 314. This content may be set (e.g., at initialization) to particular values by a memory controller and/or a memory module based on implementation requirements.

To implement the master memory device 301, the value of the mode register 313 causes the read clock driver 321 to be enabled, the external read clock receiver 325 to be disabled and for the multiplexer 317 (MUX) to select the external clock 319 received from the external clock receiver 303 as input to a phase comparator 331. The MUX 317 is an example of one type of circuitry that may be utilized to select the input to the phase comparator 331. An external clock 319 is received from either the memory controller or from another clock generator chip on the mother board. In either case, the clock will come from outside of the memory module (e.g. via a dedicated pin) by the external clock receiver 303. The external clock 319 is utilized by the master memory device 301 to generate an internal read clock as well as to generate a data clock 315.

The external clock receiver 303 sends the external clock 319 to a clock generator 305 and to the MUX 317. Because of the value of the mode register 313, the external clock 319 is selected as input to the phase comparator 331. The clock generator 305 also receives input from a clock controller 307.

The clock controller 307 may also be referred to as a phase/frequency controller in a PLL or a delay controller in a DLL. It receives phase comparison results from the phase comparator 331 and generates analog (voltage or current) or digital (digital bits) output. Because the clock generators 305 delay value will be proportional to those analog or digital outputs, the clock controller 307 adjusts its output value so that the phase difference between two input signals to the phase comparators 331 decreases as time goes by. For example, the clock controller usually accumulates (integrates in time domain) the output of the phase comparator (331/332) and multiplies it by "−1" to generate its output. If the phase comparison result is positive, the clock controller 307 output is decreased and the clock generator delay is decreased. This causes the phase comparison result to become closer to zero. As more time passes, the phase comparison result will be exactly zero, and the clock controller output will be kept constant to maintain that value (by integrating zero). The clock controller 307 receives input from the phase comparator 331. The phase comparator 331 synchronizes an internal read clock 371 generated at the master memory device 301 and the external clock 319, and then outputs the resulting clock to the clock controller 307. The internal read clock 371 is generated from the output of the clock distribution block 309 and is replicated by the read clock replica circuit 347. Thus, the internal read clock 371 is refreshed.

In this manner, the internal read clock 371 is synchronized with the external clock 319 received via the external clock receiver 303. As used herein the term "synchronized" refers to both signal edges coinciding or when both signals cross a logic threshold level at the same times. The master memory device 301 then outputs the internal read clock 371, via the read clock driver 321 to a read clock output pin, resulting in an output read clock 317 that is utilized by a memory controller for reading data from the master memory device 301. In addition, the clock distribution 309 outputs to the data out driver 311. In this manner, the data clock 315 and the read clock 317 are synchronized to the external clock 319.

To implement the slave memory device 302, the value of the mode register 314 causes the read clock driver 322 to be disabled, the external read clock receiver 326 to be enabled and for the MUX 318 to select the external read clock received from the external read clock receiver 326 as input to a phase comparator 332. The external clock 319 is received by the external clock receiver 304. The external clock receiver 304 sends the external clock 319 to a clock generator 306 and to the MUX 318. Because of the value of the mode register 314, the external read clock is selected as input to the phase comparator 332. The clock generator 306 also receives input from a clock controller 307. The clock controller 308 receives input from the phase comparator 332. The phase comparator 332 synchronizes an internal read clock 372 generated at the slave memory device 302 and the external read clock, and then outputs the resulting clock to the clock controller 308. The internal read clock 372 is generated from the output of the clock distribution block 310 and is replicated by the read clock replica circuit 348. Thus, the internal read clock 372 is refreshed.

In this manner, the internal read clock 372 is synchronized with the external read clock received via the external read clock receiver 326. The slave memory device 302 does not output the internal read clock 372 to the read clock output pin because the read clock driver 322 has been disabled. The slave memory device 302 as depicted in FIG. 3 synchronizes its internal read clock 372 with the internal read clock 371 of the master memory device 301. Thus, a memory controller may utilize the output read clock 317 from the master memory device 301 to read data from the slave memory device 302. In addition, the clock distribution block 310 outputs to the data out driver 312. In this manner, the data clock 316 and the read clock 362 are synchronized to the external clock 319.

The configuration depicted in FIG. 3 prevents there being a difference in data timing between the master memory device 301 and the slave memory device 302 due to clock routing differences and memory device to memory device variation (e.g., chip to chip tDQSCK/tAC variation that would affect a valid data eye at the memory controller receiver). Both the master memory device 301 and the slave memory device 302 have a clock generator 305, 306 (or DLL) and continuously track their internal I/O clock timings so that output data clocks 315, 316 and the output read clock 317 are synchronized to the external clock 319. The phase comparator 331 within the master memory device 301 compares the edge of the external clock and the replicated read clock edge of the internal read clock 371 out of the read clock replica circuit 347. The read clock replica circuit 347 includes replicated read clock driver and receiver circuits. Thus, the master memory device 301 synchronizes its external clock 351 and its internal read clock 371.

On the other hand, the slave memory device 302 compares its internal read clock 372 with the external read clock 362 received from the master memory device 301. From this, the internal read clocks (371, 372) of the master memory device 301 and the slave memory device 302 are synchronized, and therefore, the data timing of the slave memory device 302 is made identical to the external read clock timing of the output read clock 317 at the read clock output pin as generated by the master memory device 301.

In an exemplary embodiment, some parts of the two memory devices (i.e., the master memory device 301 and the slave memory device 302) may be configured to operate differently. For example, the read clock driver 322 of the slave memory device 302 could be in hi-Z state.

In a further exemplary embodiment, two or more slave memory devices 302 share the read clock output pin of the master memory device 301.

Figure 4:
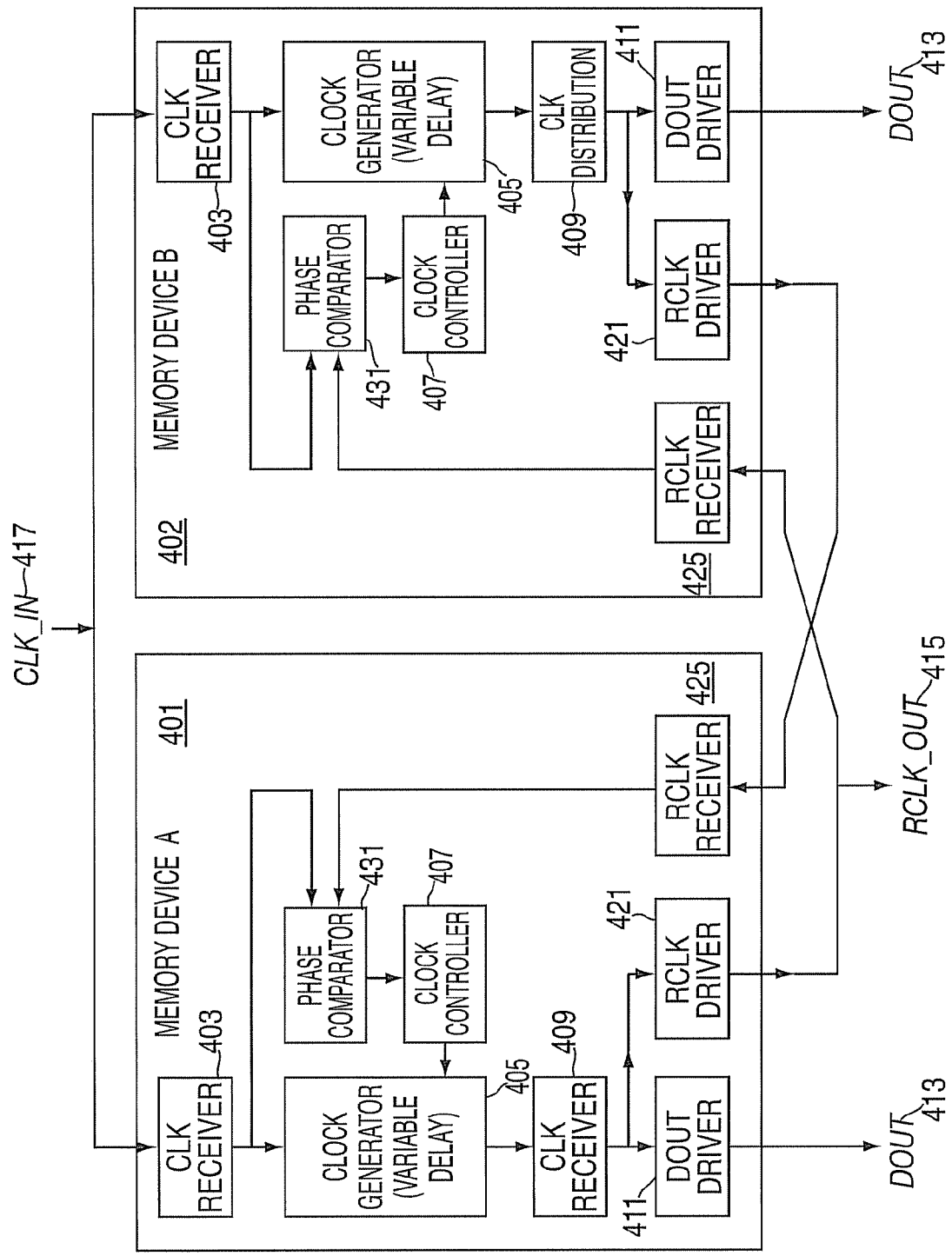
FIG. 4 is a block diagram of an exemplary embodiment of the present invention that allows two memory devices to share a read clock signal.

FIG. 4 depicts an alternate configuration for synchronizing read clocks between two memory devices. FIG. 4 is a block diagram of an exemplary embodiment of the present invention where two memory devices are sharing a read clock signal. Unlike the configuration depicted in FIG. 3, the configuration depicted in FIG. 4 cannot be extended to more than two memory devices. However, the configuration depicted in FIG. 4 makes it possible to remove the read clock replica circuits and to compare the external clock and the real output read clock 415, which may be beneficial when a memory device has a free-running read clock, not a strobe.

In FIG. 4, both memory device A 401 and memory device B 402 compare and synchronize an external clock 417 and the other memory devices' read clock. Therefore, the two memory devices (memory device A 401 and memory device B 402) cross lock to each other and eventually their internal read clock timings become identical and also coincident to the external clock 417.

As depicted in FIG. 4, an external clock 417 is received by the external clock receiver 403. The external clock 417 is utilized by memory device A 401 to generate an internal read clock as well as to generate a data clock 413. The external clock receiver 403 sends the external clock 417 to a clock generator 405 and to a phase comparator 431. The clock generator 405 also receives input from a clock controller 407. The clock controller 407 receives input from the phase comparator 431. The phase comparator 431 synchronizes an external read clock received via a read clock receiver 425 and the external clock 417, and then outputs the resulting clock to the clock controller 407. The internal read clock is generated from the output of the clock distribution block 409 and is sent to a read clock driver 421. In this manner, the internal read clock is refreshed (e.g., resynchronized).

As depicted in FIG. 4, memory device A 401 receives the external read clock from memory device B 402, and transmits it internal read clock, via the read clock driver 421 to memory device B 402. In this manner, the internal read clocks of memory device A 401 and memory device B 402 are synchronized. Thus, a memory controller may utilize the output read clock 415 sent on a single read clock output pin from either memory device A 401 or memory device B 402 to read data from memory device A 401 and memory device B 402.

The configuration depicted in FIG. 4 requires additional memory device pins, although it does not affect a connector pin count. When there is no necessity to share the output read clock 415, it is possible to simply modify the module routing so that read clock receiver 425 would generate its own output read clock. However, even in this case, it is still valuable to have two different pins for the read clock driver 421 and the read clock receiver 425 to remove internal replication and to directly compare a real internal read clock signal with the external clock 417 to minimize process, voltage and temperature (PVT) variation.

Figure 5:
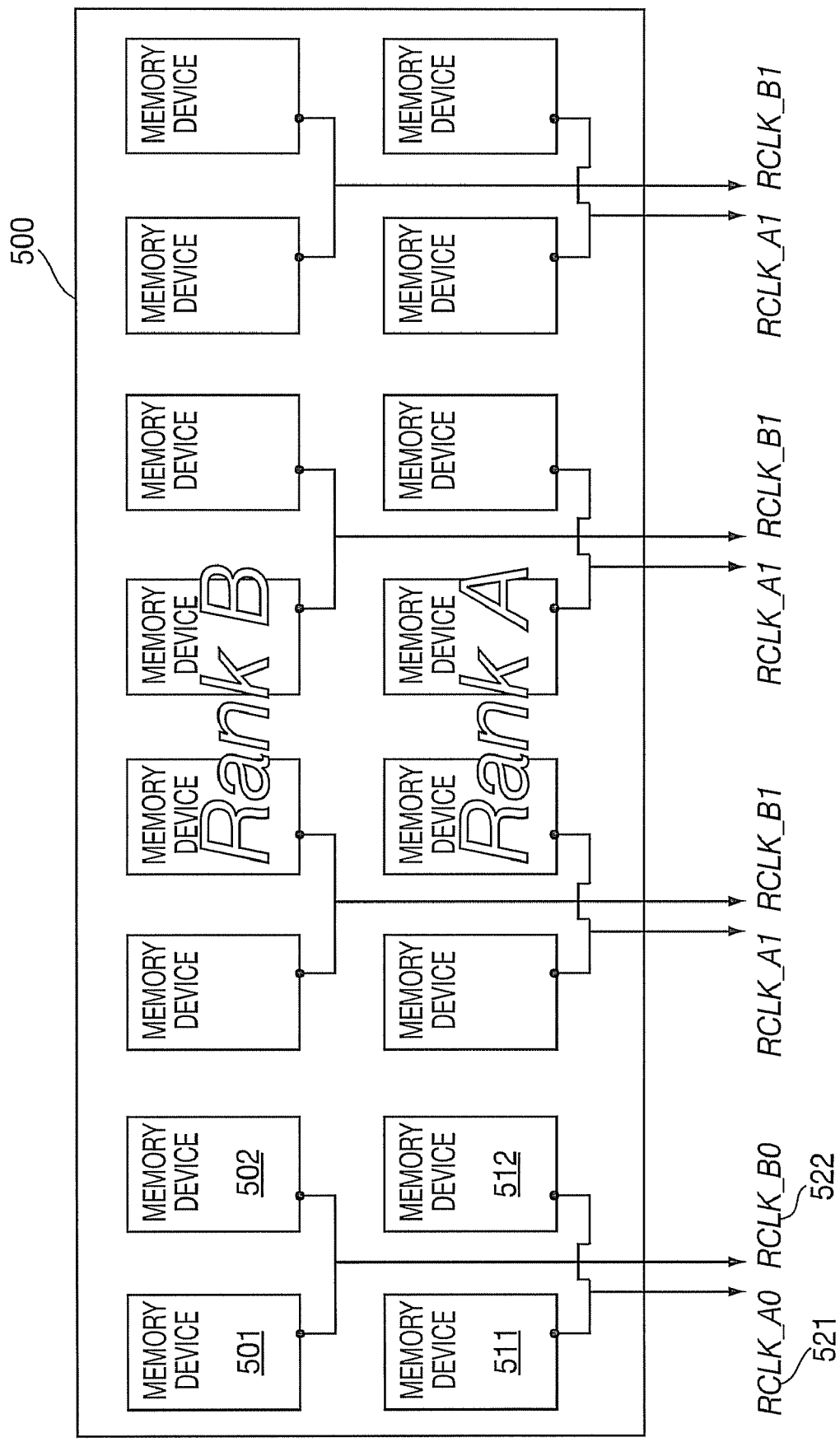
FIG. 5 depicts a memory module configuration that may be implemented by an exemplary embodiment of the present invention.
Figure 6:
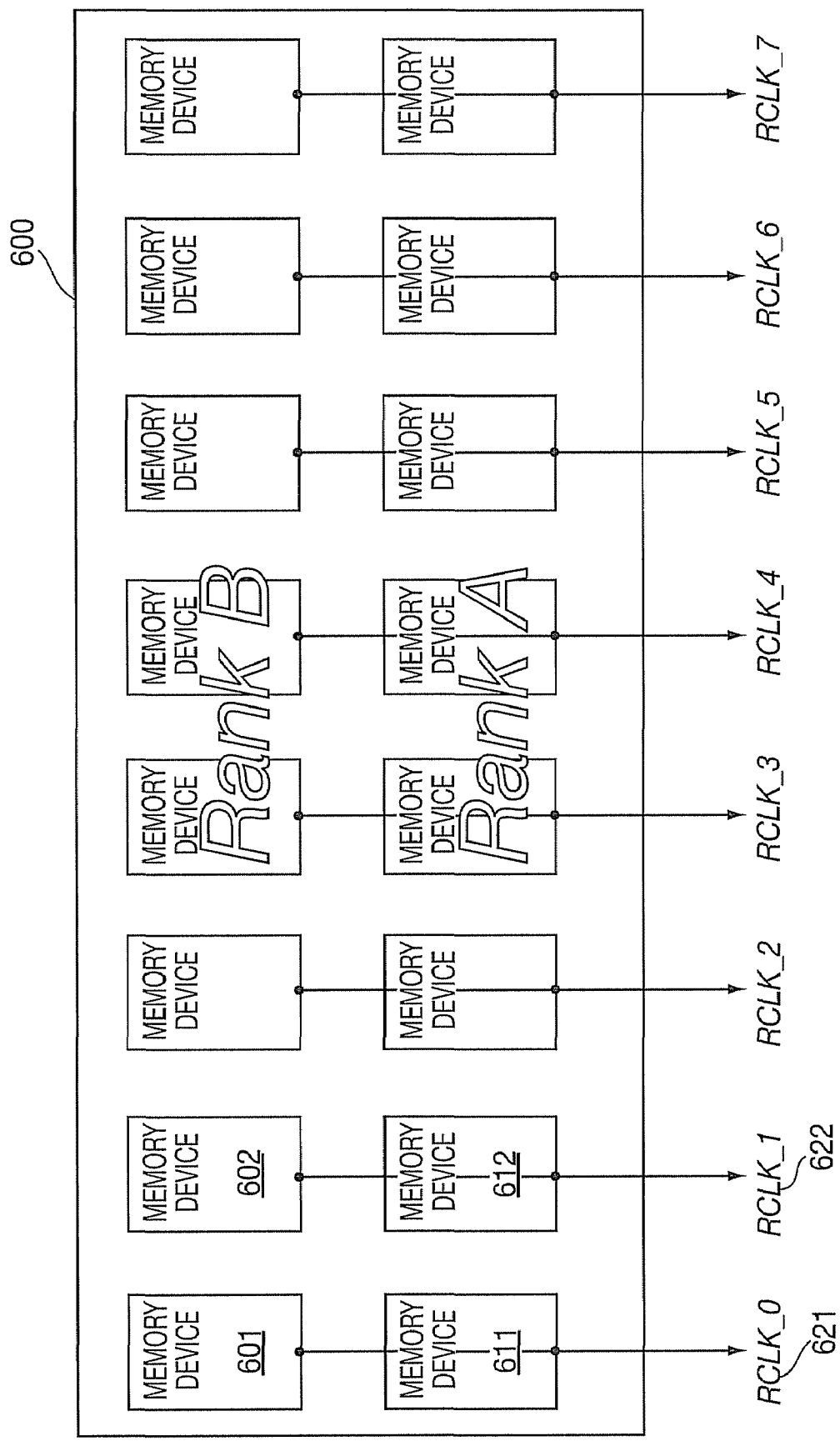
FIG. 6 depicts a memory module configuration that may be implemented by an exemplary embodiment of the present invention.

FIGS. 5 and 6 depict two example memory module configurations that may be implemented by exemplary embodiments to allow two memory devices to share one read clock signal lane, or read clock output pin. In FIG. 5, two memory devices in the same rank share a read clock signal lane. The memory module 500 depicted in FIG. 5 includes a plurality of memory devices that share read clock output pins. For example, memory device 501 and memory device 502 are both in Rank B and read clock output pin 522. Memory device 511 and memory device 512 are both in Rank A and share read clock pin 521. The memory devices depicted in FIG. 5 may be configured as depicted in FIG. 3, as depicted in FIG. 4, or as a combination of both these configurations to generate the shared output read clock. Thus, a memory controller would utilize read clock output pin 522 reading data from both memory device 501 and memory device 502, and would utilize read clock output pin 521 reading data from both memory device 511 and memory device 512.

FIG. 6 depicts a memory module configuration that may be implemented by an exemplary embodiment of the present invention. As depicted in FIG. 6, two adjacent memory devices in different ranks share the same output read clock signal lane. The memory module 600 depicted in FIG. 6 includes a plurality of memory devices that share output read clocks. For example, memory device 601 in Rank B and memory device 611 in Rank A share read clock output pin 621. Memory device 602 in Rank B and memory device 612 in Rank A share read clock output pin 622. The memory devices depicted in FIG. 6 may be configured as depicted in FIG. 3, as depicted in FIG. 4, or as a combination of both these configurations to generate the shared output read clock. Thus, a memory controller would utilize read clock output pin 621 to read data from both memory device 601 and memory device 611, and would utilize read clock output pin 622 to read data from both memory device 602 and memory device 612.

The memory module 500 depicted in FIG. 5 would be better in terms of noise correlation considering that all memory devices in a same rank would execute exactly the same operation so that their internal noise environment can be thought to be almost identical. On the other hand, the memory module configuration depicted in FIG. 6 has the benefit that the output read clock network would be exactly same as that of the data bus.

In an exemplary embodiment, hub devices may be connected to the memory controller through a multi-drop or point-to-point bus structure (which may further include a cascade connection to one or more additional hub devices). Memory access requests are transmitted by the memory controller through the bus structure (e.g., the memory bus) to the selected hub(s). In response to receiving the memory access requests, the hub device translates the memory access requests to control the memory devices to store write data from the hub device or to provide read data to the hub device. Read data is encoded into one or more communication packet(s) and transmitted through the memory bus(ses) to the memory controller.

In alternate exemplary embodiments, the memory controller(s) may be integrated together with one or more processor chips and supporting logic, packaged in a discrete chip (commonly called a "northbridge" chip), included in a multi-chip carrier with the one or more processors and/or supporting logic, or packaged in various alternative forms that best match the application/environment. Any of these solutions may or may not employ one or more narrow/high speed links to connect to one or more hub chips and/or memory devices.

The memory modules may be implemented by a variety of technology including a DIMM, a single in-line memory module (SIMM) and/or other memory module or card structures. In general, a DIMM refers to a small circuit board which is comprised primarily of random access memory (RAM) integrated circuits or die on one or both sides with signal and/or power pins on both sides of the board. This can be contrasted to a SIMM which is a small circuit board or substrate composed primarily of RAM integrated circuits or die on one or both sides and single row of pins along one long edge. DIMMs have been constructed with pincounts ranging from 100 pins to over 300 pins. In exemplary embodiments described herein, memory modules may include two or more hub devices.

In exemplary embodiments, the memory bus is constructed using multi-drop connections to hub devices on the memory modules and/or using point-to-point connections. The downstream portion of the controller interface (or memory bus), referred to as the downstream bus, may include command, address, data and other operational, initialization or status information being sent to the hub devices on the memory modules. Each hub device may simply forward the information to the subsequent hub device(s) via bypass circuitry; receive, interpret and re-drive the information if it is determined to be targeting a downstream hub device; re-drive some or all of the information without first interpreting the information to determine the intended recipient; or perform a subset or combination of these options.

The upstream portion of the memory bus, referred to as the upstream bus, returns requested read data and/or error, status or other operational information, and this information may be forwarded to the subsequent hub devices via bypass circuitry; be received, interpreted and re-driven if it is determined to be targeting an upstream hub device and/or memory controller in the processor complex; be re-driven in part or in total without first interpreting the information to determine the intended recipient; or perform a subset or combination of these options.

In alternate exemplary embodiments, the point-to-point bus includes a switch or bypass mechanism which results in the bus information being directed to one of two or more possible hub devices during downstream communication (communication passing from the memory controller to a hub device on a memory module), as well as directing upstream information (communication from a hub device on a memory module to the memory controller), often by way of one or more upstream hub devices. Further embodiments include the use of continuity modules, such as those recognized in the art, which, for example, can be placed between the memory controller and a first populated hub device (i.e., a hub device that is in communication with one or more memory devices), in a cascade interconnect memory system, such that any intermediate hub device positions between the memory controller and the first populated hub device include a means by which information passing between the memory controller and the first populated hub device can be received even if the one or more intermediate hub device position(s) do not include a hub device. The continuity module(s) may be installed in any module position(s), subject to any bus restrictions, including the first position (closest to the main memory controller, the last position (prior to any included termination) or any intermediate position(s). The use of continuity modules may be especially beneficial in a multi-module cascade interconnect bus structure, where an intermediate hub device on a memory module is removed and replaced by a continuity module, such that the system continues to operate after the removal of the intermediate hub device. In more common embodiments, the continuity module(s) would include either interconnect wires to transfer all required signals from the input(s) to the corresponding output(s), or be re-driven through a repeater device. The continuity module(s) might further include a non-volatile storage device (such as an EEPROM), but would not include main memory storage devices.

In exemplary embodiments, the memory system includes one or more hub devices on one or more memory modules connected to the memory controller via a cascade interconnect memory bus, however other memory structures may be implemented such as a point-to-point bus, a multi-drop memory bus or a shared bus. Depending on the signaling methods used, the target operating frequencies, space, power, cost, and other constraints, various alternate bus structures may be considered. A point-to-point bus may provide the optimal performance in systems produced with electrical interconnections, due to the reduced signal degradation that may occur as compared to bus structures having branched signal lines, switch devices, or stubs. However, when used in systems requiring communication with multiple devices or subsystems, this method will often result in significant added component cost and increased system power, and may reduce the potential memory density due to the need for intermediate buffering and/or re-drive.

Although not shown in the Figures, the memory modules or hub devices may also include a separate bus, such as a 'presence detect' bus, an I2C bus and/or an SMBus which is used for one or more purposes including the determination of the hub device an/or memory module attributes (generally after power-up), the reporting of fault or status information to the system, the configuration of the hub device(s) and/or memory subsystem(s) after power-up or during normal operation or other purposes. Depending on the bus characteristics, this bus might also provide a means by which the valid completion of operations could be reported by the hub devices and/or memory module(s) to the memory controller(s), or the identification of failures occurring during the execution of the main memory controller requests.

Performances similar to those obtained from point-to-point bus strictures can be obtained by adding switch devices. These and other solutions offer increased memory packaging density at lower power, while retaining many of the characteristics of a point-to-point bus. Multi-drop busses provide an alternate solution, albeit often limited to a lower operating frequency, but at a cost/performance point that may be advantageous for many applications. Optical bus solutions permit significantly increased frequency and bandwidth potential, either in point-to-point or multi-drop applications, but may incur cost and space impacts.

As used herein the term "buffer" or "buffer device" refers to a temporary storage unit (as in a computer), especially one that accepts information at one rate and delivers it another. In exemplary embodiments, a buffer is an electronic device that provides compatibility between two signals (e.g., changing voltage levels or current capability). The term "hub" is sometimes used interchangeably with the term "buffer." A hub is a device containing multiple ports that is connected to several other devices. A port is a portion of an interface that serves a congruent I/O functionality (e.g., a port may be utilized for sending and receiving data, address, and control information over one of the point-to-point links, or busses). A hub may be a central device that connects several systems, subsystems, or networks together. A passive hub may simply forward messages, while an active hub, or repeater, amplifies and refreshes the stream of data which otherwise would deteriorate over a distance. The term hub device, as used herein, refers to a hub chip that includes logic (hardware and/or software) for performing memory functions.

Also as used herein, the term "bus" refers to one of the sets of conductors (e.g., wires, and printed circuit board traces or connections in an integrated circuit) connecting two or more functional units in a computer. The data bus, address bus and control signals, despite their names, constitute a single bus since each are often useless without the others. A bus may include a plurality of signal lines, each signal line having two or more connection points, that form a main transmission path that electrically connects two or more transceivers, transmitters and/or receivers. The term "bus" is contrasted with the term "channel" which is often used to describe the function of a "port" as related to a memory controller in a memory system, and which may include one or more busses or sets of busses. The term "channel" as used herein refers to a port on a memory controller. Note that this term is often used in conjunction with I/O or other peripheral equipment, however the term channel has been adopted by some to describe the interface between a processor or memory controller and one of one or more memory subsystem(s).

Further, as used herein, the term "daisy chain" refers to a bus wiring structure in which, for example, device A is wired to device B, device B is wired to device C, etc. The last device is typically wired to a resistor or terminator. All devices may receive identical signals or, in contrast to a simple bus, each device may modify one or more signals before passing them on. A "cascade" or cascade interconnect' as used herein refers to a succession of stages or units or a collection of interconnected networking devices, typically hubs, in which the hubs operate as a logical repeater, further permitting merging data to be concentrated into the existing data stream. Also as used herein, the term "point-to-point" bus and/or link refers to one or a plurality of signal lines that may each include one or more terminators. In a point-to-point bus and/or link, each signal line has two transceiver connection points, with each transceiver connection point coupled to transmitter circuitry, receiver circuitry or transceiver circuitry. A signal line refers to one or more electrical conductors or optical carriers, generally configured as a single carrier or as two or more carriers, in a twisted, parallel, or concentric arrangement, used to transport at least one logical signal.

Memory devices are generally defined as integrated circuits that are composed primarily of memory (storage) cells, such as DRAMs (Dynamic Random Access Memories), SRAMs (Static Random Access Memories), FeRAMs (Ferro-Electric RAMs), MRAMs (Magnetic Random Access Memories), Flash Memory and other forms of random access and related memories that store information in the form of electrical, optical, magnetic, biological or other means. Dynamic memory device types may include asynchronous memory devices such as FPM DRAMs (Fast Page Mode Dynamic Random Access Memories), EDO (Extended Data Out) DRAMs, BEDO (Burst EDO) DRAMs, SDR (Single Data Rate) Synchronous DRAMs, DDR (Double Data Rate) Synchronous DRAMs or any of the expected follow-on devices such as DDR2, DDR3, DDR4 and related technologies such as Graphics RAMs, Video RAMs, LP RAM (Low Power DRAMs) which are often based on the fundamental functions, features and/or interfaces found on related DRAMs.

Memory devices may be utilized in the form of chips (die) and/or single or multi-chip packages of various types and configurations. In multi-chip packages, the memory devices may be packaged with other device types such as other memory devices, logic chips, analog devices and programmable devices, and may also include passive devices such as resistors, capacitors and inductors. These packages may include an integrated heat sink or other cooling enhancements, which may be further attached to the immediate carrier or another nearby carrier or heat removal system.

Module support devices (such as buffers, hubs, hub logic chips, registers, PLL's, DLL's, non-volatile memory, etc) may be comprised of multiple separate chips and/or components, may be combined as multiple separate chips onto one or more substrates, may be combined onto a single package or even integrated onto a single device—based on technology, power, space, cost and other tradeoffs. In addition, one or more of the various passive devices such as resistors, capacitors may be integrated into the support chip packages, or into the substrate, board or raw card itself, based on technology, power, space, cost and other tradeoffs. These packages may include an integrated heat sink or other cooling enhancements, which may be further attached to the immediate carrier or another nearby carrier or heat removal system.

Memory devices, hubs, buffers, registers, clock devices, passives and other memory support devices and/or components may be attached to the memory subsystem and/or hub device via various methods including soldered interconnects, conductive adhesives, socket structures, pressure contacts and other methods which enable communication between the two or more devices via electrical, optical or alternate means.

The one or more memory modules (or memory subsystems) and/or hub devices may be electrically connected to the memory system, processor complex, computer system or other system environment via one or more methods such as soldered interconnects, connectors, pressure contacts, conductive adhesives, optical interconnects and other communication and power delivery methods. Connector systems may include mating connectors (male/female), conductive contacts and/or pins on one carrier mating with a male or female connector, optical connections, pressure contacts (often in conjunction with a retaining mechanism) and/or one or more of various other communication and power delivery methods. The interconnection(s) may be disposed along one or more edges of the memory assembly and/or placed a distance from an edge of the memory subsystem depending on such application requirements as ease-of-upgrade/repair, available space/volume, heat transfer, component size and shape and other related physical, electrical, optical, visual/physical access, etc. Electrical interconnections on a memory module are often referred to as contacts, or pins, or tabs. Electrical interconnections on a connector are often referred to as contacts or pins.

As used herein, the term memory subsystem refers to, but is not limited to: one or more memory devices; one or more memory devices and associated interface and/or timing/control circuitry; and/or one or more memory devices in conjunction with a memory buffer, hub device, and/or switch. The term memory subsystem may also refer to one or more memory devices, in addition to any associated interface and/or timing/control circuitry and/or a memory buffer, hub device or switch, assembled into a substrate, a card, a module or related assembly, which may also include a connector or similar means of electrically attaching the memory subsystem with other circuitry. The memory modules described herein may also be referred to as memory subsystems because they include one or more memory devices and hub devices Additional functions that may reside local to the memory subsystem and/or hub device include write and/or read buffers, one or more levels of memory cache, local pre-fetch logic, data encryption/decryption, compression/decompression, protocol translation, command prioritization logic, voltage and/or level translation, error detection and/or correction circuitry, data scrubbing, local power management circuitry and/or reporting, operational and/or status registers, initialization circuitry, performance monitoring and/or control, one or more co-processors, search engine(s) and other functions that may have previously resided in other memory subsystems. By placing a function local to the memory subsystem, added performance may be obtained as related to the specific function, often while making use of unused circuits within the subsystem.

Memory subsystem support device(s) may be directly attached to the same substrate or assembly onto which the memory device(s) are attached, or may be mounted to a separate interposer or substrate also produced using one or more of various plastic, silicon, ceramic or other materials which include electrical, optical or other communication paths to functionally interconnect the support device(s) to the memory device(s) and/or to other elements of the memory or computer system.

Information transfers (e.g. packets) along a bus, channel, link or other naming convention applied to an interconnection method may be completed using one or more of many signaling options. These signaling options may include such methods as single-ended, differential, optical or other approaches, with electrical signaling further including such methods as voltage or current signaling using either single or multi-level approaches. Signals may also be modulated using such methods as time or frequency, non-return to zero, phase shift keying, amplitude modulation and others. Voltage levels are expected to continue to decrease, with 1.5V, 1.2V, 1V and lower signal voltages expected consistent with (but often independent of) the reduced power supply voltages required for the operation of the associated integrated circuits themselves.

One or more clocking methods may be utilized within the memory subsystem and the memory system itself, including global clocking, source-synchronous clocking, encoded clocking or combinations of these and other methods. The clock signaling may be identical to that of the signal lines themselves, or may utilize one of the listed or alternate methods that is more conducive to the planned clock frequency (ies), and the number of clocks planned within the various subsystems. A single clock may be associated with all communication to and from the memory, as well as all clocked functions within the memory subsystem, or multiple clocks may be sourced using one or more methods such as those described earlier. When multiple clocks are used, the functions within the memory subsystem may be associated with a clock that is uniquely sourced to the subsystem, or may be based on a clock that is derived from the clock related to the information being transferred to and from the memory subsystem (such as that associated with an encoded clock). Alternately, a unique clock may be used for the information transferred to the memory subsystem, and a separate clock for information sourced from one (or more) of the memory subsystems. The clocks themselves may operate at the same or frequency multiple of the communication or functional frequency, and may be edge-aligned, center-aligned or placed in an alternate timing position relative to the data, command or address information.

Information passing to the memory subsystem(s) will generally be composed of address, command and data, as well as other signals generally associated with requesting or reporting status or error conditions, resetting the memory, completing memory or logic initialization and other functional, configuration or related information. Information passing from the memory subsystem(s) may include any or all of the information passing to the memory subsystem(s), however generally will not include address and command information. This information may be communicated using communication methods that may be consistent with normal memory device interface specifications (generally parallel in nature), the information may be encoded into a 'packet' structure, which may be consistent with future memory interfaces or simply developed to increase communication bandwidth and/or enable the subsystem to operate independently of the memory technology by converting the received information into the format required by the receiving device(s).

Initialization of the memory subsystem may be completed via one or more methods, based on the available interface busses, the desired initialization speed, available space, cost/complexity objectives, subsystem interconnect structures, the use of alternate processors (such as a service processor) which may be used for this and other purposes, etc. In one embodiment, the high speed bus may be used to complete the initialization of the memory subsystem(s), generally by first completing a training process to establish reliable communication, then by interrogation of the attribute or 'presence detect' data associated with the various components and/or characteristics associated with that subsystem, and ultimately by programming the appropriate devices with information associated with the intended operation within that system. In a cascaded system, communication with the first memory subsystem would generally be established, followed by subsequent (downstream) subsystems in the sequence consistent with their position along the cascade interconnect bus.

A second initialization method would include one in which the high speed bus is operated at one frequency during the initialization process, then at a second (and generally higher) frequency during the normal operation. In this embodiment, it may be possible to initiate communication with all of the memory subsystems on the cascade interconnect bus prior to completing the interrogation and/or programming of each subsystem, due to the increased timing margins associated with the lower frequency operation.

A third initialization method might include operation of the cascade interconnect bus at the normal operational frequency (ies), while increasing the number of cycles associated with each address, command and/or data transfer. In one embodiment, a packet containing all or a portion of the address, command and/or data information might be transferred in one clock cycle during normal operation, but the same amount and/or type of information might be transferred over two, three or more cycles during initialization. This initialization process would therefore be using a form of 'slow' commands, rather than 'normal' commands, and this mode might be automatically entered at some point after power-up and/or re-start by each of the subsystems and the memory controller by way of POR (power-on-reset) logic included in each of these subsystems.

A fourth initialization method might utilize a distinct bus, such as a presence detect bus (such as the one defined in U.S. Pat. No. 5,513,135 to Dell et al., of common assignment herewith), an I2C bus (such as defined in published JEDEC standards such as the 168 Pin DIMM family in publication 21-C revision 7R8) and/or the SMBUS, which has been widely utilized and documented in computer systems using such memory modules. This bus might be connected to one or more modules within a memory system in a daisy chain/cascade interconnect, multi-drop or alternate structure, providing an independent means of interrogating memory subsystems, programming each of the one or more memory subsystems to operate within the overall system environment, and adjusting the operational characteristics at other times during the normal system operation based on performance, thermal, configuration or other changes desired or detected in the system environment.

Other methods for initialization can also be used, in conjunction with or independent of those listed. The use of a separate bus, such as described in the fourth embodiment above, also offers the advantage of providing an independent means for both initialization and uses other than initialization, such as described in U.S. Pat. No. 6,381,685 to Dell et al., of common assignment herewith, including changes to the subsystem operational characteristics on-the-fly and for the reporting of and response to operational subsystem information such as utilization, temperature data, failure information or other purposes.

With improvements in lithography, better process controls, the use of materials with lower resistance, increased field sizes and other semiconductor processing improvements, increased device circuit density (often in conjunction with increased die sizes) will help facilitate increased function on integrated devices as well as the integration of functions previously implemented on separate devices. This integration will serve to improve overall performance of the intended function, as well as promote increased storage density, reduced power, reduced space requirements, lower cost and other manufacturer and customer benefits. This integration is a natural evolutionary process, and may result in the need for structural changes to the fundamental building blocks associated with systems.

The integrity of the communication path, the data storage contents and all functional operations associated with each element of a memory system or subsystem can be assured, to a high degree, with the use of one or more fault detection and/or correction methods. Any or all of the various elements may include error detection and/or correction methods such as CRC (Cyclic Redundancy Code), EDC (Error Detection and Correction), parity or other encoding/decoding methods suited for this purpose. Further reliability enhancements may include operation re-try (to overcome intermittent faults such as those associated with the transfer of information), the use of one or more alternate or replacement communication paths to replace failing paths and/or lines, complement-re-complement techniques or alternate methods used in computer, communication and related systems.

The use of bus termination, on busses as simple as point-to-point links or as complex as multi-drop structures, is becoming more common consistent with increased performance demands. A wide variety of termination methods can be identified and/or considered, and include the use of such devices as resistors, capacitors, inductors or any combination thereof, with these devices connected between the signal line and a power supply voltage or ground, a termination voltage or another signal. The termination device(s) may be part of a passive or active termination structure, and may reside in one or more positions along one or more of the signal lines, and/or as part of the transmitter and/or receiving device(s). The terminator may be selected to match the impedance of the transmission line, or selected via an alternate approach to maximize the useable frequency, operating margins and related attributes within the cost, space, power and other constraints.

Technical effects and benefits include the ability to utilize a read clock for memory devices without increasing the connection pin count. This is implemented by having two or more memory devices share a read clock output pin.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. A memory device comprising:
    an external clock receiver;
    a read clock receiver;
    a phase comparator for synchronizing an internal read clock generated at the memory device and one of an external clock received by the external clock receiver and an external read clock received by the read clock receiver, wherein the results of the synchronizing are utilized to refresh the internal read clock;

a mechanism to select between the external clock and the external read clock as input to the phase comparator;
a read clock driver for outputting the internal read clock generated at the memory device to a read clock output pin; and
a mode register bit to control the selection of the mechanism, to control the enabling and disabling of the read clock receiver, and to control the enabling and disabling of the read clock driver.

2. The memory device of claim 1 wherein the value of the mode register bit causes the read clock driver to be enabled, the external read clock receiver to be disabled, and the mechanism to select the external clock.

3. The memory device of claim 2 wherein a memory controller utilizes the output of the read clock driver to read data from one or more other memory devices.

4. The memory device of claim 1 wherein the value of the mode register bit causes the read clock driver to be disabled, the external read clock receiver to be enabled, and the mechanism to select the external read clock.

5. The memory device of claim 4 wherein the memory device receives the external read clock signal from an other memory device.

6. The memory device of claim 1 wherein the value of the mode register bit is set by a memory controller.

7. The memory device of claim 1 wherein the value of the mode register bit is set by a memory module.

8. A memory device comprising:
an external clock receiver for receiving an external read clock;
a read clock receiver for receiving an external clock;
a phase comparator for synchronizing the external clock and the external read clock, wherein the results of the synchronizing are utilized to generate an internal read clock; and
a read clock driver for outputting the internal read clock.

9. The memory device of claim 8, wherein the memory device is in communication with an other memory device to synchronize the internal read clock with an internal read clock on the other memory device.

10. The memory device of claim 9 wherein the read clock receiver is coupled to a read clock driver on the other memory device, and the read clock driver is coupled to a read clock receiver on the other memory device.

11. The memory device of claim 9 wherein the memory device and the other memory device output one of the internal read clock of the memory device and the internal read clock of the other memory device to a read clock output pin.

12. The memory device of claim 11 wherein the read clock output pin is utilized by a memory controller to read data from the memory device and from the other memory device.

13. A memory module comprising:
a read clock output pin for outputting an internal read clock generated by a read clock driver; and
a plurality of memory devices that share the read clock output pin.

14. The memory module of claim 13 wherein two or more of the memory devices are in different memory ranks.

15. The memory of claim 13 wherein the memory devices are in the same memory rank.

16. The memory module of claim 13 wherein:
one of the memory devices includes a first memory device configured to:
receive an external clock via an external clock receiver;
synchronize the external clock and an internal read clock generated at the first memory device;
refresh the internal read clock of the first device in response to the synchronizing;
output the internal clock to the read clock output pin; and
one or more of the other memory devices include a second memory device configured to:
receive the internal read clock of the first memory device;
synchronize the internal read clock of the first memory device and an internal read clock generated at the second memory device; and
refresh the internal read clock of the second device in response to the synchronizing;
thereby allowing the read clock output pin to be shared between the first memory device and the one or more second memory devices.

17. The memory module of claim 16 wherein the configuration of the first memory device and the configuration of the second memory device is programmable via a command from one or more of a memory controller and a memory module.

18. The memory module of claim 16 wherein the read clock output pin is utilized by a memory controller to read data from the first memory device and the one or more second memory devices.

19. The memory module of claim 13 wherein the memory devices include:
a first memory device and a second memory device;
the first memory device configured to:
receive an external clock via an external clock receiver on the first memory device;
synchronize the external clock received at the first memory device and an internal read clock generated at the second memory device;
refresh the internal read clock of the first memory device in response to the synchronizing; and
output the internal clock to the read clock output pin; and
the second memory device configured to:
receive an external clock via an external clock receiver on the second memory device;
synchronize the external clock received at the second memory device and an internal read clock generated at the first memory device; and
refresh the internal read clock of the second memory device in response to the synchronizing;
thereby allowing the read clock output pin to be shared between the first memory device and the second memory device.

20. The memory module of claim 19 wherein the read clock output pin is utilized by a memory controller to read data from the first memory device and the second memory device.

* * * * *